(12) United States Patent
Johnson

(10) Patent No.: US 7,030,674 B2
(45) Date of Patent: *Apr. 18, 2006

(54) MULTIPHASE CLOCK GENERATORS

(75) Inventor: Brian Johnson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/103,679

(22) Filed: Apr. 12, 2005

(65) Prior Publication Data

US 2005/0212580 A1   Sep. 29, 2005

Related U.S. Application Data

(63) Continuation of application No. 10/656,987, filed on Sep. 5, 2003, now Pat. No. 6,894,551.

(51) Int. Cl.
  *H03H 11/16* (2006.01)
(52) U.S. Cl. ............... 327/258; 327/117; 327/257; 327/295
(58) Field of Classification Search ............. 327/113, 327/114, 115, 117, 231, 238, 254, 261, 255–258, 327/269, 285, 293, 295; 377/47, 48
  See application file for complete search history.

(56) References Cited

U.S. PATENT DOCUMENTS

| | | | | |
|---|---|---|---|---|
| 5,022,057 A | 6/1991 | Nishi et al. | ............. | 375/373 |
| 5,349,622 A | 9/1994 | Gorisse | ............. | 377/52 |
| 5,389,826 A | 2/1995 | Sonobe | ............. | 307/125 |
| 5,485,195 A | 1/1996 | Nacman | ............. | 347/247 |
| 5,867,046 A | 2/1999 | Sugasawa | ............. | 327/258 |
| 5,907,589 A | 5/1999 | Koifman et al. | ............. | 377/47 |
| 5,948,046 A | 9/1999 | Hagberg | ............. | 708/103 |
| 6,177,787 B1 * | 1/2001 | Hobrecht | ............. | 323/283 |
| 6,191,718 B1 | 2/2001 | Matsumoto | ............. | 341/143 |
| 6,211,715 B1 * | 4/2001 | Terauchi | ............. | 327/295 |
| 6,242,953 B1 | 6/2001 | Thomas | ............. | 327/115 |
| 6,249,157 B1 | 6/2001 | Nakura | ............. | 327/117 |
| 6,373,911 B1 | 4/2002 | Tajima | ............. | 375/575 |
| 6,501,816 B1 | 12/2002 | Kouznetsov | ............. | 377/48 |
| 6,545,518 B1 | 4/2003 | Saeki | ............. | 327/116 |
| 6,566,918 B1 | 5/2003 | Nguyen | ............. | 321/115 |
| 6,759,886 B1 * | 7/2004 | Nakanishi | ............. | 377/47 |
| 6,826,250 B1 * | 11/2004 | Groo | ............. | 377/47 |
| 6,894,551 B1 * | 5/2005 | Johnson | ............. | 327/258 |
| 6,917,662 B1 * | 7/2005 | Austin et al. | ............. | 377/47 |
| 2002/0059536 A1 | 5/2002 | Saeki | | |

* cited by examiner

*Primary Examiner*—Kenneth B. Wells
*Assistant Examiner*—Hai L. Nguyen
(74) *Attorney, Agent, or Firm*—Leffert Jay & Polglaze, P.A.

(57) ABSTRACT

Multiphase clock generators and methods are provided. A multiphase clock generator has a first clock divider for generating a first-phase clock signal from a first input clock signal. A first logic gate is connected to an output port of the first clock divider. A second clock divider is connected to an output port of the first logic gate. The second clock divider is for generating a second-phase clock signal from the first input clock signal. A second logic gate is connected to an output port of the second clock divider. A third clock divider is connected to an output port of the second logic gate. The third clock divider is for generating a third-phase clock signal from a second input clock signal.

35 Claims, 3 Drawing Sheets

MULTIPHASE CLOCK GENERATORS

CROSS REFERENCE TO RELATED APPLICATIONS

This is a continuation application of U.S. patent application Ser. No. 10/656,987, filed Sep. 5, 2003, titled "MULTIPHASE CLOCK GENERATORS," now U.S. Pat. No. 6,894,551 B2, which application is commonly assigned, the entire contents of which are incorporated herein by reference.

TECHNICAL FIELD OF THE INVENTION

The present invention relates generally to clock generators and in particular the present invention relates to multiphase clock generators.

BACKGROUND OF THE INVENTION

Clock signals are used for timing or synchronizing operations within many electronic devices. For example, clock signals are used for timing or synchronizing read and write operations for memories, such as flash memories, dynamic random access memories (DRAMs), static random access memories (SRAMs), etc., of electronic devices, such as desktop or portable computers. For some applications, clock signals are used to control data latching for read and write applications. For one application, such as for double-data-rate DRAMs, it is advantageous to latch data, for example, every half-clock cycle. This typically involves using a first latch of a latch system to latch data when the clock signal goes from low to high, i.e., on a positive clock transition (or positive clock edge), and using a second latch of the latch system to latch data a half clock cycle later when the clock signal goes from high to low, i.e., on a negative clock transition (or negative clock edge).

Typically, latches that latch data on positive clock transitions are of a different type than latches that latch data on negative clock transitions. For example, latches that latch data on positive clock transitions are often p-channel devices, whereas latches that latch data on negative clock transitions are often n-channel devices. One problem with this is that different type latches can cause timing variations that can distort the data output of the latch system. Therefore, it is often advantageous to latch data on a single clock edge, either positive or negative. Four-phase clocks can used to generate positive or negative clock edges at half clock cycle intervals. Each clock phase is then used to control a latch of a latch system having common latch types.

One method of developing a four-phase clock is to use each phase of a two phase-clock to drive two clock dividers. The clock dividers are then started in sequence at half clock cycle intervals. This often involves aligning a first phase of the two-phase clock with a second phase of the two-phase clock so that the first and second phases are a half clock cycle out of phase. That is, so that the first clock phase transitions high when the second clock phase transitions low and vice versa. Then, a first divider is started from a reset state when the first phase of the two-phase clock transitions high to start the first phase of the four-phase clock. A half clock cycle later, a second divider is started from a reset state when the second phase of the two-phase clock transitions high to start the second phase of the four-phase clock. Another half clock cycle later, a third divider is started from a reset state when the first phase of the two-phase clock transitions high again to start the third phase of the four-phase clock. Another half-clock cycle later, a fourth divider is started from a reset state when the second phase of the two-phase clock transitions high again to start the fourth phase of the four-phase clock. However, for relatively high frequencies, the half cycle intervals do not provide enough time to start the dividers owing to logic delays and startup times for the dividers.

For the reasons stated above, and for other reasons stated below which will become apparent to those skilled in the art upon reading and understanding the present specification, there is a need in the art for alternatives for starting phases of multiphase clocks.

SUMMARY

The above-mentioned problems with clock generators and other problems are addressed by the present invention and will be understood by reading and studying the following specification.

Various embodiments of the present invention relate to multiphase clock generators and methods. The clock generators generate multiple clock phases from one or more input clock signals using clock dividers. Successive clock phases are started out of order to provide more time between starting the clock phases for starting the clock dividers. After all of the clock phases are started, the clock phases are aligned so that successive clock phases are evenly displaced.

For one embodiment, the invention provides a first clock divider having a first input for receiving a first input clock signal, a second input for receiving a reset signal and an output for providing a first output clock signal; a second clock divider having a first input for receiving the first input clock signal, a second input for receiving a reset signal and an output for providing a second output clock signal; a third clock divider having a first input for receiving a second input clock signal, a second input for receiving a reset signal and an output for providing a third output clock signal; and a fourth clock divider having a first input for receiving the second input clock signal, a second input for receiving a reset signal and an output for providing a fourth output clock signal. The reset signal for the first clock divider is generated from a first reset signal; the reset signal for the second clock divider is generated from the first reset signal and the first output clock signal; the reset signal for the third clock divider is generated from the first reset signal, the second output clock signal and the second input clock signal; and the reset signal for the fourth clock divider is generated from the first reset signal and the third output clock signal.

For another embodiment, the invention provides a method of operating a multiphase clock generator. The method includes placing first, second, third and fourth clock dividers in a reset state in response to a first reset signal having a first logic level, wherein the first and second clock dividers are coupled to receive a first input clock signal and the third and fourth clock dividers are coupled to receive a second input clock signal, and where outputs of the first, second, third and fourth clock dividers assume a logic low level in their reset states. Starting the first clock divider from its reset state in response to the first reset signal transitioning to a second logic level, starting the second clock divider from its reset state in response to the first reset signal transitioning to its second logic level and the output of the first clock divider transitioning to a logic high level, starting the third clock divider from its reset state in response to the second input clock signal having the logic high level and the output of the second clock divider transitioning to a logic high level, and starting the fourth clock divider from its reset state in response to the first reset signal transitioning to its second logic level and the output of the third clock divider transitioning to a logic high level are included in the method.

Further embodiments of the invention include methods and apparatus of varying scope.

DETAILED DESCRIPTION

Figure 1:
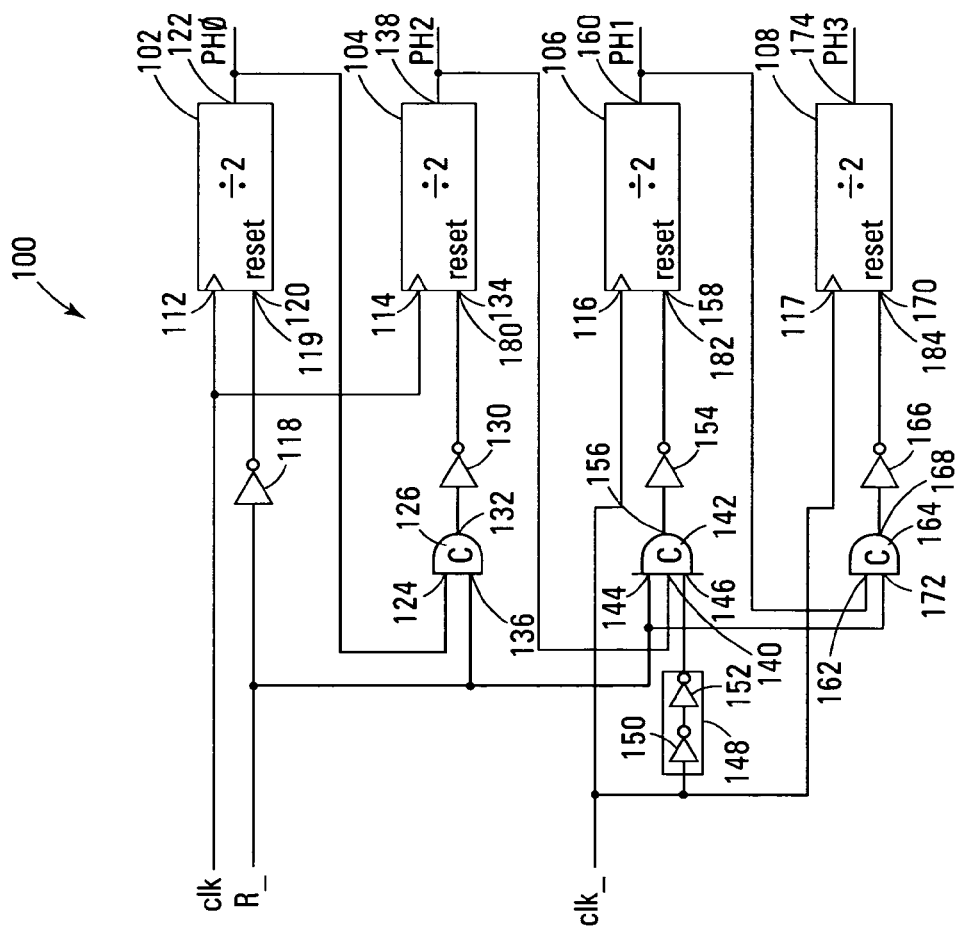
FIG. 1 illustrates a multiphase clock generator according to an embodiment of the present invention.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

FIG. 1 illustrates a multiphase clock generator 100 according to an embodiment of the present invention. Clock generator 100 has clock dividers 102, 104, 106, and 108. For one embodiment, clock dividers 102 and 104 divide the frequency (or multiply the period) of an input clock signal CLK by a number, e.g., two, and clock dividers 106 and 108 divide the frequency (or multiply the period) of an input clock signal CLK_ by a number, e.g., two. CLK is received at input ports 112 and 114 respectively of clock dividers 102 and 104, while CLK_ is received at input ports 116 and 117 respectively of clock dividers 106 and 108.

Figure 2:
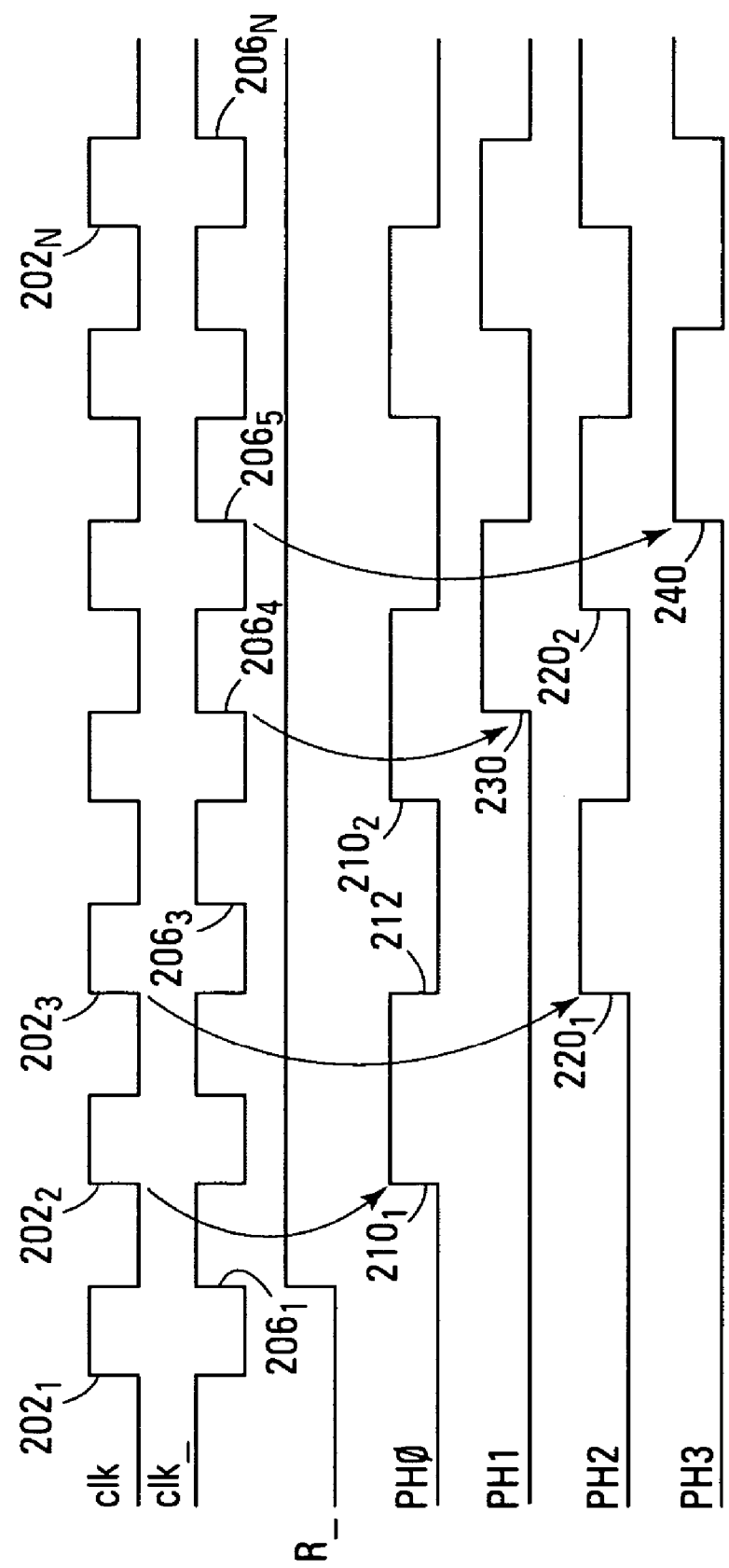
FIG. 2 illustrates timing of various clock phases according to another embodiment of the present invention.

For another embodiment, CLK and CLK_ are respective phases of a two-phase clock. CLK and CLK_ are illustrated in FIG. 2. For one embodiment, CLK and CLK_ are complimentary clock cycles having the same period and are aligned so that they are a half clock cycle (or clock period) out of phase, i.e., 180 degrees, as shown in FIG. 2. That is, positive clock edges 202 of CLK are shifted by a half-clock cycle from positive clock edges 206 of CLK_. This can be accomplished using a phase-locked loop (PLL), a delay-locked loop (DLL), etc. Positive clock edges 202 and 206 respectively correspond to CLK transitioning high (or going from low to high) and CLK_ transitioning high.

An inverter 118 is connected to an input port 120 of clock divider 102. Inverter 118 receives a reset signal R_, shown for one embodiment in FIG. 2, and transmits a reset signal 119 that is an inversion of reset signal R_ to input port 120. An output port 122 of clock divider 102 is connected to an input port 124 of a logic gate 126, such as a Muller C gate. An inverter 130 is connected between an output 132 of logic gate 126 and an input port 134 of clock divider 104. Logic gate 126 also has an input port 136 for receiving reset signal R_.

It will be appreciated by those skilled in the art that the output of a Muller C gate goes to logical one (or high) if all inputs are logical one. The output goes to logical zero (or low) if all inputs are logical zero. The output stays at the previous value if the inputs differ.

An output port 138 of clock divider 104 is connected to an input 140 of a logic gate 142, such as a modified (or asymmetric) Muller C gate. Logic gate 142 includes an input port 144 for receiving reset signal R_ and an input port 146 connected to a repeater (or buffer) 148 that for one embodiment, includes inverters 150 and 152. Repeater 148 receives CLK_ and sends CLK_ to input port 146 of logic gate 142 without changing the orientation of CLK_. For one embodiment, repeater 148 acts to decrease the load on CLK_. An inverter 154 is connected between an output port 156 of logic gate 142 and an input port 158 of clock divider 106.

It will be appreciated by those skilled in the art that the output of a modified Muller C gate goes to logic zero (or low) when first and second inputs are at logic zero, regardless of the logic value at a third input. The output goes to logic one (or high) when the second and third inputs are at logic one, regardless of the logic value at the first input. The output remains at the previous value for all other combinations of the logic values of the first, second, and third inputs.

An output port 160 of clock divider 106 is connected to an input port 162 of a logic gate 164, such as a Muller C gate. An inverter 166 is connected between an output 168 of logic gate 164 and an input port 170 of clock divider 108. Logic gate 164 also has an input port 172 for receiving reset signal R_. Clock divider 108 also has an output port 174. For another embodiment, output ports 122, 138, 160, 174 are connected to latches, such as read data latches, e.g., of a DRAM. For other embodiments, output ports 122, 138, 160, and 174 respectively output a phase-0 (PH0) clock signal, a phase-2 (PH2) clock signal, a phase-1 (PH1) clock signal, and a phase-3 (PH3) clock signal. The PH0, PH2, PH1, and PH3 clock signals are illustrated for one embodiment in FIG. 2.

For one embodiment, when logic gate 126 (or logic gate 164) receives two inputs having a common logic value, an output of logic gate 126 (or logic gate 164) assumes the common logic value. When logic gate 126 (or logic gate 164) receives two inputs having different logic values, the output of logic gate 126 (or logic gate 164) remains unchanged. For example, when both of the inputs of logic gate 126 (or logic gate 164) are logic ones (or logic highs), the output of logic gate 126 (or logic gate 164) is logic one (or logic high). When both of the inputs of logic gate 126 (or logic gate 164) are logic zeros (or logic lows), the output of logic gate 126 (or logic gate 164) is logic zero (or logic low). When the inputs of logic gate 126 (or logic gate 164) have different logic values, e.g., logic zero and logic one, the output of logic gate 126 (or logic gate 164) is the output from when both of the inputs previously had the same logic value. For example, when different logic input values follow two logic one inputs, the output stays at logic one, or when different logic input values follow two logic zero inputs, the output stays at logic zero.

For another embodiment, when the inputs to input ports 140 and 144 of logic gate 142 are both logic zeros (or logic low values), the output value at output port 156 is a logic zero (or a logic low value), regardless of whether the input to input port 146 is a logic one or zero (or a logic high or low value). When the inputs to input ports 140 and 146 are both logic ones (or logic high values), the output value at output port 156 is a logic one (or a logic high value), regardless of whether the input to input port 144 is a logic one or zero (or a logic high or low value). For all other combinations of input values to input ports 140, 144, and 146, the output value at output port 156 stays at the value from when the inputs to input ports 140 and 144 were last both logic zeros or when the inputs to input ports 140 and 146 were last both logic ones.

For one embodiment, reset signal R_ is initially low, as shown in FIG. 2, and clock dividers 102, 104, 106, and 108 are initially at a reset state. When clock dividers 102, 104, 106, and 108 are at the reset state, the PH0, PH2, PH1, and PH3 clock signals are low, e.g., at a logic zero, as shown in FIG. 2. For one embodiment, clock dividers 102, 104, 106, and 108 are in a reset state when reset signals 119, 180, 182, and 184 respectively at input ports 119, 134, 158, and 170 are high (or are turned on).

When reset signal R_ is low, reset signal 119 is high, causing signal divider 102 to be reset and thus the PH0 clock signal to be low. Consequently, the PH0 clock signal and reset signal R_ are respective low inputs of input ports 124 and 136 of logic gate 126, causing the output of logic gate 126 to be low. Inverter 130 inverts the output of logic gate 126 to produce reset signal 180, thus reset signal 180 is high, clock divider 104 is at the reset state, and the PH2 clock signal is low. Consequently, the PH2 clock signal and reset signal R_ are respective low inputs of input ports 144 and 140 of logic gate 142, causing the output of logic gate 142 to be low. Inverter 154 inverts the output of logic gate 142 to produce reset signal 182, thus reset signal 182 is high, clock divider 106 is at the reset state, and the PH1 clock signal is low. Consequently, the PH1 clock signal and reset signal R_ are respective low inputs of input ports 162 and 172 of logic gate 164, causing the output of logic gate 164 to be low. Inverter 166 inverts the output of logic gate 164 to produce reset signal 184, thus reset signal 184 is high, clock divider 108 is at the reset state, and the PH3 clock signal is low.

When R_ transitions high, as shown in FIG. 2, the reset signal 119 at input port 120 of clock divider 102 transitions low and is thus turned off, removing clock divider 102 from the reset state. When CLK transitions high, e.g., at a half a clock cycle of CLK after R_ transitions high, positive clock edge $202_2$ of CLK is produced at input port 112 of clock divider 102. The PH0 clock signal starts at positive clock edge $202_2$, e.g., by transitioning high to produce a positive clock edge $210_1$ of the PH0 clock signal, as shown in FIG. 2.

Consequently, the PH0 clock signal and reset signal R_ are respective high inputs of input ports 124 and 136 of logic gate 126, causing the output of logic gate 126 to be high and reset signal 180 to be low. Therefore, reset signal 180 is turned off and clock divider 104 is removed from the reset state. When positive clock edge $202_3$ occurs at input port 114 of clock divider 104, the PH2 clock signal starts at positive clock edge $202_3$, e.g., by transitioning high to produce a positive clock edge $220_1$ of the PH2 clock signal, as shown in FIG. 2.

For one embodiment, positive clock edge $220_1$ coincides with negative clock edge 212 of the PH0 clock signal, as shown in FIG. 2. That is, the PH0 clock signal transitions low when the PH2 clock signal transitions high and vice versa, and the PH0 and PH2 clock signals are one clock cycle of CLK out of phase. The one clock cycle of CLK between the start of the PH0 and PH2 clock signals compensates for logic delays and startup times of the clock dividers that can cause problems at relatively high frequencies for conventional clock generators that generate successive clock phases at half cycle intervals of CLK.

The PH2 clock signal and reset signal R_ are respective high inputs of input ports 144 and 140 of logic gate 142. When CLK_ transitions high to produce positive clock edge $206_3$ at input port 146 of logic gate 142 via repeater 148, the output of logic gate 142 goes high. Therefore, reset signal 182 is turned off and clock divider 106 is removed from the reset state. When positive clock edge $206_4$ occurs at input port 116 of clock divider 106, the PH1 clock signal starts at positive clock edge $206_4$, e.g., by transitioning high to produce a positive clock edge 230 of the PH1 clock signal, as shown in FIG. 2.

For one embodiment, positive clock edge $206_4$ occurs one-and-one-half clock cycles of CLK (or CKL_ ) after positive clock edge $202_3$. This compensates for logic delays and startup times of the clock dividers. Moreover, the occurrence of positive clock edge $206_4$ one-and-one-half clock cycles of CLK after positive clock edge $202_3$ means that positive clock edge 230 occurs one-and-one-half clock cycles of CLK after positive clock edge $220_1$ (the start) of the PH2 clock signal and thus one half clock cycle of CLK before a positive clock edge $220_2$ of the PH2 clock signal occurs, as shown in FIG. 2. Positive clock edge $206_4$ occurs two-and-one-half clock cycles of CLK (or CKL_ ) after positive clock edge $202_2$. This means that positive clock edge 230 occurs two-and-one-half clock cycles of CLK after positive clock edge $210_1$ (the start) of the PH0 clock signal and thus one half clock cycle of CLK after a positive clock edge $210_2$ of the PH0 clock signal occurs, as shown in FIG. 2.

The PH1 clock signal and reset signal R_ are respective high inputs of input ports 162 and 172 of logic gate 164, causing the output of logic gate 164 to be high and reset signal 184 to be low. Therefore, reset signal 184 is turned off and clock divider 108 is removed from the reset state. When positive clock edge $206_5$ of CLK_ occurs at input port 117 of clock divider 108, the PH3 clock signal starts at positive clock edge $206_5$, e.g., by transitioning high to produce a positive clock edge 240 of the PH3 clock signal, as shown in FIG. 2.

For one embodiment, positive clock edge $206_5$ occurs one clock cycle of CLK (or CKL_) after positive clock edge $206_4$. This compensates for logic delays and startup times of the clock dividers. Moreover, the occurrence of positive clock edge $206_5$ one clock cycle of CLK after positive clock edge $206_4$ means that positive clock edge 240 occurs one clock cycle of CLK after positive clock edge 230 (the start) of the PH1 clock signal and thus one half clock cycle of CLK after positive clock edge $220_2$ of the PH2 clock signal and one-and-one-half clock cycles of CLK after positive clock edge $210_2$ of the PH0, as shown in FIG. 2. Therefore, positive clock edges $210_2$, 230, $220_2$, and 240, respectively of the PH0, PH1, PH2 and PH3 clock signals, are respectively displaced by one half of a clock cycle of CLK (or CKL_ ). This represents the proper displacement between the positive clock edges of the PH0, PH1, PH2, and PH3 clock signals for one embodiment. Note that this is accomplished by starting the PH0, PH1, PH2, and PH3 clock signals out of order, i.e., PH0, followed by PH2, followed by PH1, followed by PH3. Starting the PH0, PH1, PH2, and PH3 clock signals out of order provides more time for starting the clock dividers.

Figure 3:
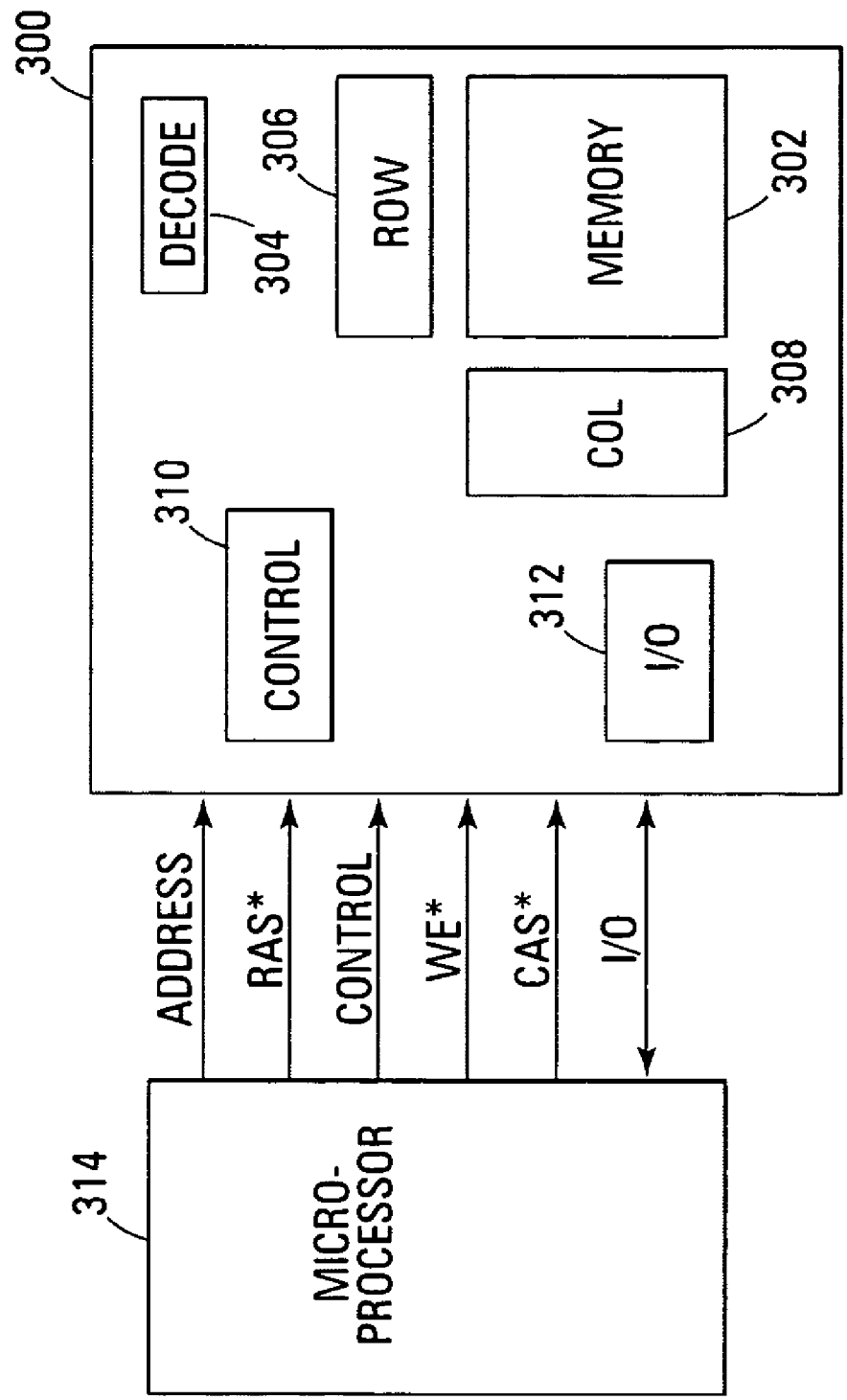
FIG. 3 is a block diagram of a memory system according to another embodiment of the present invention.

FIG. 3 is a simplified block diagram of an integrated circuit memory device 300 as a dynamic memory device, e.g., a DRAM (Dynamic Random Access Memory), in accordance with an embodiment of the invention. The memory device 300 includes an array of memory cells 302, an address decoder 304, row access circuitry 306, column access circuitry 308, control circuitry 310 for controlling access to the array of memory cells 302, and Input/Output (I/O) circuitry 312.

The memory device 300 can be coupled to an external microprocessor 314, or memory controller for memory accessing as part of an electronic system. The memory device 300 receives control signals from the processor 314, such as WE*, RAS* and CAS* signals. The memory cells are used to store data that are accessed via I/O lines. Control circuitry 310 decodes the control signals from processor 314 and controls access to the memory cells. These signals are used to control the operations of memory device 300, including data read and data write operations. The memory cells are accessed in response to the control signals and the address signals. For one embodiment, the control circuitry 310 includes circuitry for generating a multiphase clock, such as clock generator 100 of FIG. 1, in accordance with the invention. It will be appreciated by those skilled in the art that additional circuitry and control signals can be provided, and that the memory device of FIG. 3 has been simplified to help focus on the invention.

It will be understood that the above description of a DRAM is intended to provide a general understanding of the memory and is not a complete description of all the elements and features of a DRAM. Further, the invention is equally applicable to a variety of sizes and types of memory circuits known in the art, such as flash memory circuits, and is not intended to be limited to the DRAM described above.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A multiphase clock generator, comprising:
   a first clock divider having a first input for receiving a first input clock signal, a second input for receiving a reset signal and an output for providing a first output clock signal;
   a second clock divider having a first input for receiving the first input clock signal, a second input for receiving a reset signal and an output for providing a second output clock signal;
   a third clock divider having a first input for receiving a second input clock signal, a second input for receiving a reset signal and an output for providing a third output clock signal; and
   a fourth clock divider having a first input for receiving the second input clock signal, a second input for receiving a reset signal and an output for providing a fourth output clock signal;
   wherein the reset signal for the first clock divider is generated from a first reset signal;
   wherein the reset signal for the second clock divider is generated from the first reset signal and the first output clock signal;
   wherein the reset signal for the third clock divider is generated from the first reset signal, the second output clock signal and the second input clock signal; and
   wherein the reset signal for the fourth clock divider is generated from the first reset signal and the third output clock signal.

2. The multiphase clock generator of claim 1, wherein the reset signal for the first clock divider is an inverted first reset signal.

3. The multiphase clock generator of claim 1, wherein the reset signal for the second clock divider is an inverted first reset signal when the first reset signal and the first output clock signal have the same logic level.

4. The multiphase clock generator of claim 1, wherein the reset signal for the third clock divider is an inverted first reset signal when the first reset signal and the second output clock signal are logic low.

5. The multiphase clock generator of claim 4, wherein the reset signal for the third clock divider is an inverted second input clock signal when the second input clock signal and the second output clock signal are logic high.

6. The multiphase clock generator of claim 1, wherein the reset signal for the fourth clock divider is an inverted first reset signal when the first reset signal and the third output clock signal have the same logic level.

7. The multiphase clock generator of claim 1, wherein logic for generating the reset signals for the second and fourth clock generators each comprises a Muller C gate.

8. The multiphase clock generator of claim 1, wherein logic for generating the reset signal for the third clock generator comprises an asymmetric Muller C gate.

9. The clock generator of claim 1, wherein the first and second input clock signals have the same frequency and are half the clock cycle of the first input clock signal out of phase.

10. The clock generator of claim 1, further comprising a logic gate connected between the output of the first clock divider for providing the first output clock signal and the second input of the second clock divider for receiving the reset signal.

11. The clock generator of claim 10, further comprising an inverter connected between an output of the logic gate and the second input of the second clock divider for receiving the reset signal.

12. The clock generator of claim 1, further comprising a logic gate connected between the output of the second clock divider for providing the second output clock signal and the second input of the third clock divider for receiving the reset signal.

13. The clock generator of claim 12, further comprising an inverter connected between an output of the logic gate and the second input of the third clock divider for receiving the reset signal.

14. The clock generator of claim 13, further comprising a repeater connected between an input of the logic gate and the second clock signal.

15. The clock generator of claim 1, further comprising a logic gate connected between the output of the third clock divider for providing the third output clock signal and the second input of the fourth clock divider for receiving the reset signal.

16. The clock generator of claim 15, further comprising an inverter connected between an output of the logic gate and the second input of the fourth clock divider for receiving the reset signal.

17. A method of operating a multiphase clock generator, the method comprising:
   placing first, second, third and fourth clock dividers in a reset state in response to a first reset signal having a first logic level, wherein the first and second clock dividers are coupled to receive a first input clock signal and the third and fourth clock dividers are coupled to receive a second input clock signal, and wherein outputs of the first, second, third and fourth clock dividers assume a logic low level in their reset states;

starting the first clock divider from its reset state in response to the first reset signal transitioning to a second logic level;

starting the second clock divider from its reset state in response to the first reset signal transitioning to its second logic level and the output of the first clock divider transitioning to a logic high level;

starting the third clock divider from its reset state in response to the second input clock signal having a logic high level and the output of the second clock divider transitioning to a logic high level; and starting the fourth clock divider from its reset state in response to the first reset signal transitioning to its second logic level and the output of the third clock divider transitioning to a logic high level.

18. The method of claim 17, wherein placing the first clock divider in a reset state in response to a first reset signal having a first logic level further comprises inverting the first reset signal.

19. The method of claim 17, wherein placing the second clock divider in a reset state in response to a first reset signal having a first logic level further comprises:
receiving the logic low output from the first clock divider at a first input of a logic gate;
receiving the first reset signal at a second input of the logic gate, wherein the first logic level thereof is a logic low;
inverting an output from the logic gate, wherein the output from the logic gate has a logic low level; and
receiving the inverted output of the logic gate at the second clock divider.

20. The method of claim 17, wherein placing the third clock divider in a reset state in response to a first reset signal having a first logic level further comprises:
receiving the logic low output from the second clock divider at a first input of a logic gate;
receiving the first reset signal at a second input of the logic gate, wherein the first logic level thereof is a logic low;
inverting an output from the logic gate, wherein the output from the logic gate has a logic low level irrespective of a logic value at a third input of the logic gate; and
receiving the inverted output of the logic gate at the third clock divider.

21. The method of claim 17, wherein placing the fourth clock divider in a reset state in response to a first reset signal having a first logic level further comprises:
receiving the logic low output from the third clock divider at a first input of a logic gate;
receiving the first reset signal at a second input of the logic gate, wherein the first logic level thereof is a logic low;
inverting an output from the logic gate, wherein the output from the logic gate has a logic low level; and
receiving the inverted output of the logic gate at the fourth clock divider.

22. The method of claim 17, wherein the output of the first clock divider transitions to the logic high level in response to:
inverting the first reset signal from the second logic level, wherein the second logic level is a logic high level;
receiving the inverted first rest signal at a first input of the first clock divider; and
the first input clock signal transitioning to a logic high level at a second input of the first clock divider.

23. The method of claim 22, wherein the first input clock signal transitions to the logic high level a half a clock cycle of the first input clock signal after the first reset signal transitions to the second logic level.

24. The method of claim 17, wherein the output of the second clock divider transitions to the logic high level in response to:
receiving the first reset signal at the second logic level at a first input of a logic gate, wherein the second logic level is a logic high level;
receiving the output of the first clock divider at the logic high level at a second input of the logic gate;
inverting an output from the logic gate, wherein the output of the logic gate is at a logic high level;
receiving the inverted output of the logic gate at a first input of the second clock divider; and
the first input clock signal transitioning to a logic high level at a second input of the second clock divider.

25. The method of claim 17, wherein the output of the third clock divider transitions to the logic high level in response to:
receiving the output of the second clock divider at the logic high level at a first input of the logic gate;
receiving the second input clock signal at a second input of the logic gate and the second input clock signal transitioning to a logic high level;
inverting an output from the logic gate, wherein the output of the logic gate is at a logic high level regardless of the logic level of the first reset signal at a third input of the logic gate;
receiving the inverted output of the logic gate at a first input of the third clock divider; and
the second input clock signal transitioning to a logic high level at a second input of the third clock divider.

26. The method of claim 17, further comprising an output of the fourth clock divider transitioning to a logic high level in response to:
receiving the first reset signal at the second logic level at a first input of a logic gate, wherein the second logic level is a logic high level;
receiving the output of the third clock divider at the logic high level at a second input of the logic gate;
inverting an output from the logic gate, wherein the output of the logic gate is at a logic high level;
receiving the inverted output of the logic gate at a first input of the fourth clock divider; and
the second input clock signal transitioning to a logic high level at a second input of the fourth clock divider.

27. The method of claim 17, wherein the first and second input clock signals have the same frequency and are half the clock cycle of the first input clock signal out of phase.

28. The method of claim 17, wherein the output signal of the second clock divider transitions to its logic high value one clock cycle of the first input clock signal after the output of the first clock divider transitions to its logic high value.

29. The method of claim 28, wherein the output signal of the third clock divider transitions to its logic high value two and one half clock cycles of the first input clock signal after the output of the first clock divider transitions to its logic high value.

30. The method of claim 29, wherein an output of the fourth clock divider transitions to a logic high value three and one half clock cycles of the first input clock signal after the output of the first clock divider transitions to its logic high value.

31. A method of operating a multiphase clock generator, the method comprising:

resetting a plurality of clock dividers in response to a first reset signal having a first logic level, wherein each clock divider is coupled to receive an input clock signal and a reset signal, wherein each clock divider is adapted to provide an output clock signal having a first logic level or a second logic level during operation, and wherein each output clock signal assumes its first logic level when its corresponding clock divider assumes its reset state;

transitioning the first reset signal to a second logic level;

starting a first clock divider from its reset state in response to the first reset signal transitioning to its second logic level and a first input clock signal transitioning from a first logic level to a second logic level;

starting a second clock divider from its reset state in response to the first reset signal transitioning to its second logic level, the output clock signal of the first clock divider transitioning to its second logic level and the first input clock signal transitioning to its second logic level;

starting a third clock divider from its reset state in response to the output clock signal of the second clock divider transitioning to its second logic level and a second input clock signal transitioning from a first logic level to a second logic level; and starting a fourth clock divider from its reset state in response to the first reset signal transitioning to its second logic level, the output clock signal of the third clock divider transitioning to its second logic level and the second input clock signal transitioning to its second logic level.

32. The method of claim 31, wherein the first and second input clock signals have the same frequency and are half the clock cycle of the first input clock signal out of phase.

33. The method of claim 31, wherein the output clock signal of the second clock divider transitions to its second logic level one clock cycle of the first input clock signal after the output clock signal of the first clock divider transitions to its second logic level.

34. The method of claim 31, wherein the output clock signal of the third clock divider transitions to its second logic level two and one half clock cycles of the first input clock signal after the output clock signal of the first clock divider transitions to its second logic level.

35. The method of claim 31, wherein the output clock signal of the fourth clock divider transitions to its second logic level three and one half clock cycles of the first input clock signal after the output clock signal of the first clock divider transitions to its second logic level.

* * * * *